United States Patent
Li

(10) Patent No.: US 10,367,038 B2
(45) Date of Patent: Jul. 30, 2019

(54) ORGANIC LIGHT-EMITTING DIODE DISPLAY DEVICE AND MANUFACTURING METHOD THEREOF, AND ORGANIC LIGHT-EMITTING DIODE DISPLAY

(71) Applicant: Shenzhen China Star Optoelectronics Technology Co., Ltd., Shenzhen, Guangdong (CN)

(72) Inventor: Xianjie Li, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 120 days.

(21) Appl. No.: 15/520,348

(22) PCT Filed: Apr. 5, 2017

(86) PCT No.: PCT/CN2017/079435
§ 371 (c)(1),
(2) Date: Apr. 19, 2017

(87) PCT Pub. No.: WO2018/152933
PCT Pub. Date: Aug. 30, 2018

(65) Prior Publication Data
US 2018/0301514 A1  Oct. 18, 2018

(30) Foreign Application Priority Data
Feb. 24, 2017 (CN) .................. 2017 1 0102872

(51) Int. Cl.
*H01L 27/32* (2006.01)
*H01L 51/50* (2006.01)
(Continued)

(52) U.S. Cl.
CPC ........ *H01L 27/322* (2013.01); *H01L 51/0077* (2013.01); *H01L 51/5036* (2013.01);
(Continued)

(58) Field of Classification Search
CPC ............... H01L 27/322; H01L 27/3209; H01L 51/0077; H01L 51/5036; H01L 51/56
See application file for complete search history.

(56) References Cited

U.S. PATENT DOCUMENTS

2012/0217867 A1* 8/2012 Nagai ................... G02B 5/201
313/504
2013/0021549 A1  1/2013 Fujita
(Continued)

FOREIGN PATENT DOCUMENTS

CN   101481556 A   7/2009
CN   102916138 A   2/2013
(Continued)

*Primary Examiner* — Phuc T Dang
(74) *Attorney, Agent, or Firm* — Andrew C. Cheng

(57) ABSTRACT

The present invention provides an OLED display device and a manufacturing method thereof, and an OLED display. The OLED display device comprises a substrate, and a color conversion layer and a blue light emitting layer are stacked sequentially on the substrate; the color conversion layer comprises red light conversion units, green light conversion units, and opening units which are arranged separately; the red light conversion unit and the green light conversion unit are both film layers made of an organometallic halide perovskite material. The red light conversion unit and the green light conversion unit absorb blue light emitted from the blue light emitting layer and convert the blue light into red light and green light, respectively, and the opening unit transmits the blue light, so that the color conversion layer can output color light with high saturation to achieve color display.

17 Claims, 3 Drawing Sheets

(51) Int. Cl.
*H01L 51/00* (2006.01)
*H01L 51/56* (2006.01)

(52) U.S. Cl.
CPC ...... *H01L 51/56* (2013.01); *H01L 2251/5369* (2013.01); *H01L 2251/5376* (2013.01)

(56) References Cited

U.S. PATENT DOCUMENTS

| | | |
|---|---|---|
| 2015/0003040 A1 | 1/2015 | Bessho et al. |
| 2015/0228697 A1 | 8/2015 | Liu et al. |
| 2016/0027848 A1 | 1/2016 | Liu et al. |
| 2016/0178960 A1* | 6/2016 | Kim .................. G02F 1/133617 362/293 |
| 2016/0268347 A1* | 9/2016 | Yan ..................... H01L 51/5012 |
| 2017/0018369 A1* | 1/2017 | Nakamura ........... H01G 9/2031 |
| 2017/0125740 A1* | 5/2017 | Lee ....................... H01L 27/322 |

FOREIGN PATENT DOCUMENTS

| | | | |
|---|---|---|---|
| CN | 105870287 A | 8/2016 | |
| CN | 105870287 A | 8/2016 | |

\* cited by examiner

ORGANIC LIGHT-EMITTING DIODE DISPLAY DEVICE AND MANUFACTURING METHOD THEREOF, AND ORGANIC LIGHT-EMITTING DIODE DISPLAY

FIELD OF THE INVENTION

The present invention relates to a technology of organic light-emitting diode (OLED) device, and more particularly, to an OLED display device, a manufacturing method thereof, and an OLED display.

DESCRIPTION OF PRIOR ART

OLED display has self-luminous, simple structure, light, fast response, wide viewing angle, low power consumption and can achieve flexible display and other characteristics, so as to be known as the "dream display." Because of its many advantages, OLED display has been the major display manufacturers' favorite, and becomes the third generation of the display after cathode ray display (CRT) and liquid crystal display (LCD.)

OLED display device for OLED display is one important component of its, the color display of OLED display device has a great influence of display quality of the OLED display. In the prior art, the color display of the OLED display device is mainly carried out by two methods, one of them is to manufacture an OLED display device having three sub-pixels of red, green, and blue by fine metal mask (FMM) to achieve color display, but the method is limited by FMM, its resolution cannot be improved, and the high-resolution requirements cannot be satisfied. In addition, the other method is to use white light and RGB filters, this method does not require mask alignment, so it is not limited by the FMM, but its color saturation is low, and its color gamut is not wide enough. Currently, color gamut of the OLED display manufactured by using white light and RGB filters is only 86% of the standard color gamut of the National Television Standards Committee.

SUMMARY OF THE INVENTION

In view of the above, the present invention provides an OLED display device and a manufacturing method thereof, and an OLED display. The OLED display device of the present invention can improve saturation and color gamut of its color display.

To solve deficiencies of prior art described above, the present invention provides a manufacturing method of OLED display device, which comprises: arranging a color conversion layer on the substrate by wet film formation; arranging a thin film transistor array, an anode, a hole injection layer, sequentially, and a hole transport layer, a blue light emitting layer, an electron transport layer, an electron injection layer, and a cathode.

Wherein the color conversion layer comprises red light conversion units, green light conversion units, and opening units which are arranged separately; the red light conversion unit and the green light conversion unit are both film layers made of an organometallic halide perovskite material; the red light conversion unit and the green light conversion unit absorb respectively blue light emitted from the blue light emitting layer and convert the blue light into red light and green light, and the opening unit transmits the blue light to achieve color display.

The present invention further provides an OLED display device, which comprises: a substrate, and a color conversion layer and a blue light emitting layer are stackedsequentially on the substrate.

Wherein the color conversion layer comprises red light conversion units, green light conversion units, and opening units which are arranged separately; the red light conversion unit and the green light conversion unit are both film layers made of an organometallic halide perovskite material; the red light conversion unit and the green light conversion unit absorb respectively blue light emitted from the blue light emitting layer and convert the blue light into red light and green light, and the opening unit transmits the blue light to achieve color display.

The present invention further provides an OLED display, which comprises an OLED display device and a drive control circuit, the drive control circuit is connected to the OLED display device to supply drive signals and control signals to the OLED display device; the OLED display device comprises: a substrate, and a color conversion layer and a blue light emitting layer are stackedsequentially on the substrate.

Wherein the color conversion layer comprises red light conversion units, green light conversion units, and opening units which are arranged separately; the red light conversion unit and the green light conversion unit are both film layers made of an organometallic halide perovskite material; the red light conversion unit and the green light conversion unit absorb respectively blue light emitted from the blue light emitting layer and convert the blue light into red light and green light, and the opening unit transmits the blue light to achieve color display.

The present invention can be concluded with the following advantages, different from the prior art, the OLED display device of the present invention comprises a substrate, and a color conversion layer and a blue light emitting layer are stacked sequentially on the substrate; the color conversion layer comprises red light conversion units, green light conversion units, and opening units which are arranged separately; the red light conversion unit and the green light conversion unit are both film layers made of an organometallic halide perovskite material. Because the red light conversion unit and the green light conversion unit are both film layers made of an organometallic halide perovskite material, which has high luminous efficiency, the red light conversion unit and the green light conversion unit absorb blue light emitted from the blue light emitting layer and convert the blue light into red light and green light with high saturation, respectively, and the opening unit transmits the blue light emitted from the blue light emitting layer, so that the color conversion layer can output color light with high saturation to achieve color display, and improve saturation and color gamut of its color display.

DESCRIPTION OF PREFERRED EMBODIMENT

Technical implementation will be described below clearly and fully by combining with drawings made in accordance with an embodiment in the present invention. In the attached figures, numeral reference through different drawings represents the same element.

Figure 1:
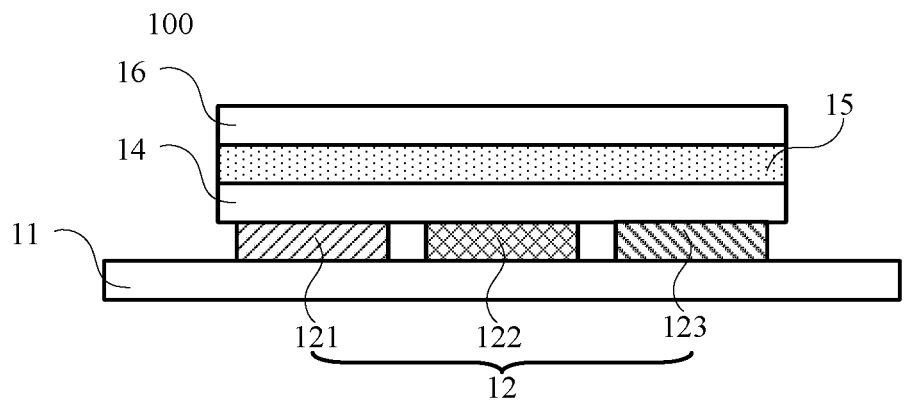
FIG. 1 is a structural illustration of the first embodiment made in accordance to an OLED display device in the present invention.

Referring to FIG. 1, FIG. 1 is a structural illustration of the first embodiment made in accordance to an OLED display device in the present invention. As shown in FIG. 1, the OLED display device 100 of the embodiment comprises: a substrate 11, and a color conversion layer 12 and a blue light emitting layer 15 are stacked sequentially on the substrate 11. The color conversion layer 12 comprises red light conversion units 121, green light conversion units 122, and opening units 123 which are arranged separately. The red light conversion unit 121 and the green light conversion unit 122 are both film layers made of an organometallic halide perovskite material. It should be noticed that, in FIG. 1, the structure between the color conversion layer 12 and the blue light emitting layer 15 is simplified to a first structure 14, and the structure above the blue light emitting layer 15 is simplified to a second structure 16.

The organometallic halide perovskite material used to manufacture the red light conversion unit 121 and the green light conversion unit 122 is a kind of semiconductor material with photoelectric properties, which has low bulk trap density and high photoluminescence efficiency, and adjustable wavelength can be achieved by changing its components. In addition, this kind of material has photoelectric characteristic of the inorganic semiconductor and low temperature film forming characteristic of the organic material.

In the present embodiment, using blue light with high saturation emitted from the blue light emitting layer 15, the red light conversion unit 121 and the green light conversion unit 122 absorb the blue light emitted from the blue light emitting layer 15, respectively, and convert the blue light into red light and green light, the opening unit 123 transmits the blue light. Wherein the red light conversion unit 121, the green light conversion unit 122, and the opening unit 123 correspond to one pixel, respectively, and the pixel includes a red subpixel, a green subpixel, and a blue subpixel. The red light conversion unit 121 corresponds to red sub-pixel, the green light conversion unit 122 corresponds to green sub-pixel, and the opening unit 123 corresponds to blue subpixel. The red subpixel, the green subpixel, and the blue subpixel correspond to a thin-film transistor to control each subpixel corresponding to the red light conversion unit 121, the green light conversion unit 122, and the opening unit 123, respectively, and then can display three primary colors to achieve color display.

Figure 2:
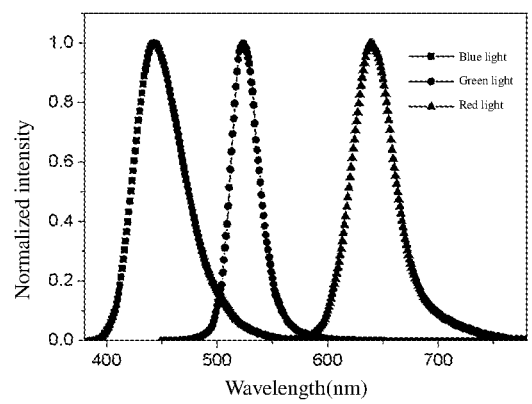
FIG. 2 is a spectrum diagram of the red light, green light and blue light obtained by the OLED display device shown in FIG. 1.

Referring to FIG. 2, FIG. 2 is a spectrum diagram of the red light, green light and blue light obtained by the OLED display device shown in FIG. 1. In addition, in the OLED display device of the present embodiment, the coordinates of the red, green, and blue light in the CIE standard spectrum are (0.697, 0.303), (0.170, 0.757), and (0.148, 0.041), respectively. The color gamut can reach 120.2% of the standard color gamut of the National Television Standards Committee of United States.

Figure 3:
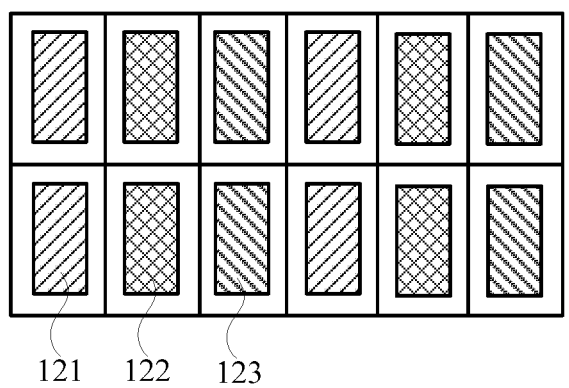
FIG. 3 is an illustrational and arrangement view of the color conversion layer in the OLED display device shown in FIG. 1.

Referring to FIG. 3, FIG. 3 is an illustrational and arrangement view of the color conversion layer 12 in the OLED display device 100 shown in FIG. 1. As shown in FIG. 3, the red light conversion unit 121, the green light conversion unit 122, and the opening unit 123 in each adjacent two rows are arranged in the same arrangement in the color conversion layer 12, the red light conversion unit 121, the green light conversion unit 122, and the opening unit 123 in each row are arranged in the order from left to right in the horizontal direction.

In the present invention, the red light conversion unit and the green light conversion unit both absorb and convert the blue light emitted from the same blue light emitting layer, it does not need to manufacture sub-pixels of the three primary colors by FMM. That is, it is not limited by the FMM, and its resolution can be improved according to the requirement, and its manufacturing process is simple, the manufacturing cost of the OLED display device can be reduced. Based on the properties of the organometallic halide perovskite material, the OLED display device made of the organometallic halide perovskite material has a thinner device thickness and can be used in large-size OLED displays.

Specifically, the organometallic halide perovskite material used to manufacture the red light conversion unit 121 and the green light conversion unit 122, is a single material containing an organometallic halide perovskite material or a mixed material containing a plurality of organometallic halide perovskite materials. Further, the organometallic halide perovskite material has the structural formula $CH_3NH_3PbA_3$, wherein A is at least one element of chlorine, bromine, and iodine.

Films corresponding to the red light conversion unit 121 and the green light conversion unit 122 can be arranged by wet film formation on the substrate. The thickness of the films may be between 10 nanometers and 200 nanometers. The thickness of the red light conversion unit 121 is the same as the thickness of the green light conversion unit 122.

The blue light emitting layer 15 comprises organic host materials and blue light emitting organic guest materials, i.e., the organic host material and the blue light emitting organic guest material are doped according to a specific mass ratio. The blue light emitting layer 15 can emit high brightness, high saturation blue light or dark blue light by changing the doping ratio of the blue light emitting organic guest material.

Further, the blue light emitting organic guest material of the blue light emitting layer 15 may be organic fluorescent materials, and the organic host material is anthracene derivatives or wide band gap organic materials. In addition, the blue light emitting organic guest material may further be organic phosphorescent materials, and the organic host material is wide band gap organic materials.

The doping mass ratio of the organic host material and the blue light emitting organic guest material in the blue light emitting layer 15 affects the luminous efficiency thereof and the saturation of the blue light, preferably, the doping mass ratio of the organic host material and the blue light emitting organic guest material may be 1:0.01 to 1:1. Wherein, the greater proportion of the doping mass ratio of the blue light emitting organic guest material, the saturation of the blue light emitting layer 15 will increase.

Figure 4:
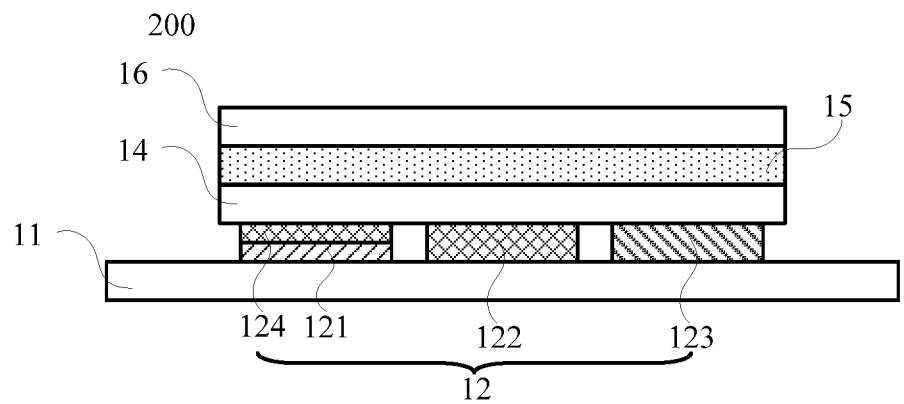
FIG. 4 is a structural illustration of the second first embodiment made in accordance to an OLED display device in the present invention.

Referring to FIG. 4, FIG. 4 is a structural illustration of the second first embodiment made in accordance to an OLED display device in the present invention. As shown in FIG. 4, the OLED display device 200 of the present embodiment also comprises a substrate 11, and a color conversion layer 12 and a blue light emitting layer 15 are stacked sequentially on the substrate 11.

The blue light emitting layer 15 in the present embodiment is the same as the blue light emitting layer 15 in the OLED display device 100 shown in FIG. 1, therefore no additional description is given herebelow.

The color conversion layer 12 of the present embodiment comprises red light conversion units 121, green light conversion units 122, and opening units 123 which are arranged separately. Wherein a green light conversion subunit 124 is further arranged on the red light conversion unit 121. The red light conversion unit 121, the green light conversion unit 122 and the green light conversion subunit 124 are both film layers made of an organometallic halide perovskite material.

In the present embodiment, the green light conversion subunit 124 above the red light conversion unit 121 absorbs the blue light emitted from the blue light emitting layer 15 and converts the blue light into green light passing through the red light conversion unit 121 so that the red conversion unit emits red light; The green light conversion unit 122 absorbs the blue light emitted from the blue light emitting layer 15 and converts the blue light into green light; the opening unit 123 transmits the blue light emitted from the blue light emitting layer 15, so the OLED display device can achieve color display.

It should be noticed that, in the present embodiment, the red light conversion unit 121, the green light conversion unit 122, and the opening unit 123 are arranged in the same arrangement as the color conversion layer 12 shown in FIG. 3.

In the present embodiment, films corresponding to the red light conversion unit 121, the green light conversion unit 122, and the green light conversion subunit 124 can be arranged by wet film formation. The green light conversion unit 122 may have a thickness of between 10 nanometers and 200 nanometers. The red light conversion unit 121 and the green light conversion subunit 124 are stacked, and the sum of the thicknesses of the two is the same as the thickness of the green light conversion unit 122.

Figure 5:
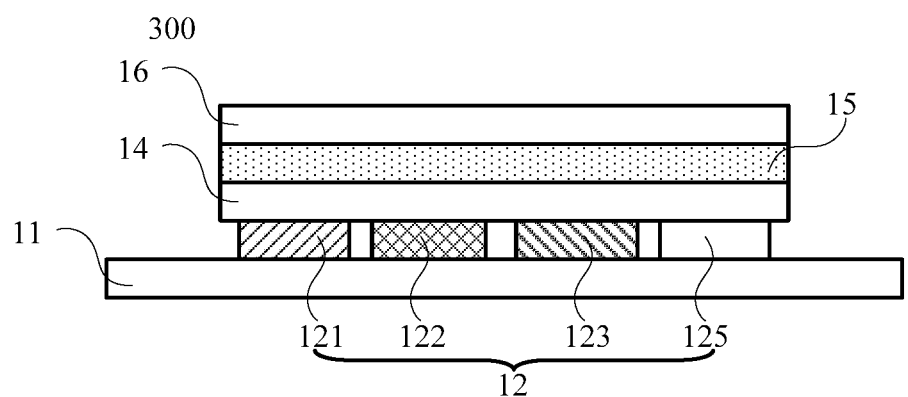
FIG. 5 is a structural illustration of the third embodiment made in accordance to an OLED display device in the present invention.

Further, referring to FIG. 5, FIG. 5 *is* a structural illustration of the third embodiment made in accordance to an OLED display device in the present invention. The present embodiment is improved base on the OLED display device 100 of the first embodiment shown in FIG. 1. As shown in FIG. 5, the OLED display device 300 comprises a substrate 11, and a color conversion layer 12 and a blue light emitting layer 15 are stacked sequentially on the substrate 11. The color conversion layer 12 comprises red light conversion units 121, green light conversion units 122, and opening units 123 which are arranged separately. In addition, the color conversion layer 12 further comprises white light conversion units 125.

In the present embodiment, the blue light emitting layer 15, the red light conversion unit 121, the green light conversion unit 122, and the opening unit 123 are the same as structural in the OLED display device of the first embodiment shown in FIG. 1, therefore no additional description is given herebelow. The difference is that the white light conversion unit 125 is arranged in the side of the red light conversion unit 121, the green light conversion unit 122, or the opening unit 123.

Figure 6A:
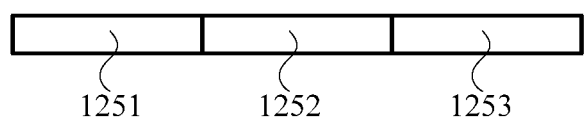
FIG. 6a is a structural illustration of the white light conversion unit in the OLED display device of the first embodiment shown in FIG. 5.

As shown in FIG. 6a, the white light conversion unit 125 comprises opening subunits 1251, red light conversion subunits 1253, and green light conversion subunits 1252 arranged side by side. Further, the opening subunit 1251, the red light conversion subunit 1253, and the green light conversion subunit 1252 in the white light conversion unit 125 are closely connected to each other without gaps. In this case, the film thickness of the red light conversion subunit 1253 is the same as the film thickness of the green light conversion subunit 1252. The red light conversion subunit 1253 and the green light conversion subunit 1252 absorb blue light emitted from the blue light emitting layer and convert the blue light into red light and green light, respectively, and the opening subunit 1251 transmits the blue light emitted from the blue light emitting layer; the opening subunit 1251, the red light conversion subunit 1253, and the green light conversion subunit 1252 are operated simultaneously to convert the blue light emitted from the blue light emitting layer into white light, thereby it can improve the brightness of the OLED display device and display quality.

Figure 6B:
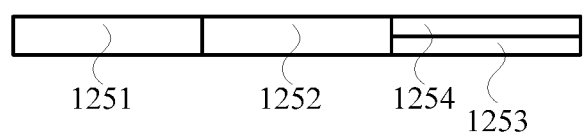
FIG. 6b is a structural illustration of the white light conversion unit in the OLED display device of the second embodiment shown in FIG. 5.

In addition, as shown in FIG. 6b, the red light conversion subunit 1253 in the white light conversion unit 125 further comprises the green light conversion subunit 1254 on the red light conversion subunit 1253. The green light conversion subunit 1254 absorbs the blue light emitted from the blue light emitting layer and converts the blue light into green light, then converts the green light into red light by the red light conversion subunit 1253.

Figure 7:
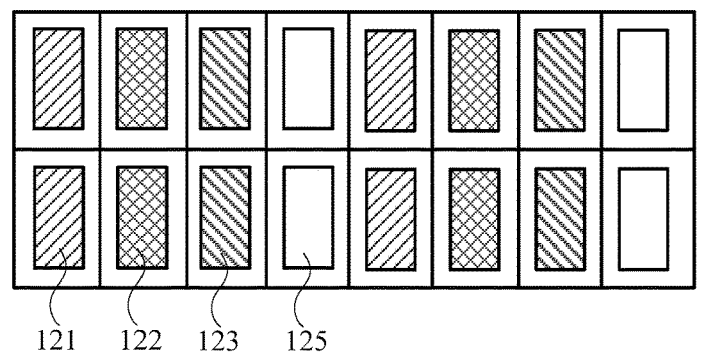
FIG. 7 is an illustrational and arrangement view of the color conversion layer in the OLED display device of an embodiment shown in FIG. 5.
Figure 8:
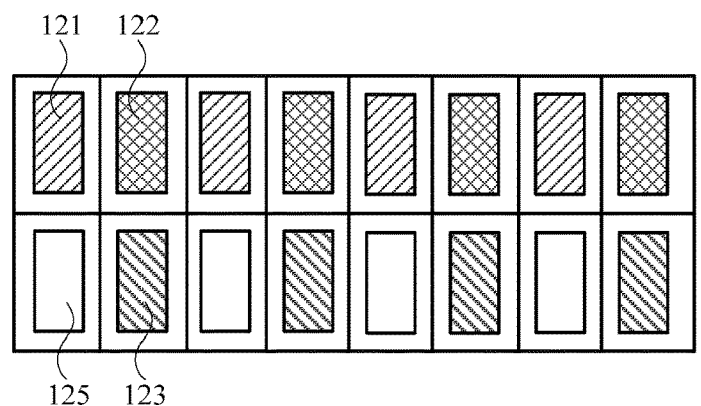
FIG. 8 is an illustrational and arrangement view of the color conversion layer in the OLED display device of another embodiment shown in FIG. 5.

In the OLED display device of the third embodiment described above, the red light conversion unit, the green light conversion unit, the opening unit, and the white light conversion unit correspond to one pixel, respectively. Referring to FIG. 7, FIG. 7 an illustrational and arrangement view of the color conversion layer 12 in the OLED display device 300 shown in FIG. 5. As shown in FIG. 7, the red light conversion unit 121, the green light conversion unit 122, the opening unit 123, and the white light conversion unit 125 in each adjacent two rows are arranged in the same arrangement in the color conversion layer 12, the red light conversion unit 121, the green light conversion unit 122, the opening unit 123, and the white light conversion unit 125 in each row are arranged separately in the order from left to right in the horizontal direction. In addition, referring to FIG. 8, in the present embodiment, the red light conversion unit 121, the green light conversion unit 122, the opening unit 123, and the white light conversion unit 125 may also be arranged in an array, i.e., the red light conversion unit 121, the green light conversion unit 122, the opening unit 123, and the white light conversion unit 125 are arranged sequentially and separately along the clockwise direction. In addition, the red light conversion unit 121, the green light conversion unit 122, the opening unit 123, and the white light conversion unit 125 may also be arranged sequentially and separately along the counterclockwise direction.

It should be noticed that the display effect of the OLED display device of the present invention is independent of the arrangement of the respective conversion units in the color conversion layer, it can be applied to OLED display devices with different pixel arrangement.

Figure 9:
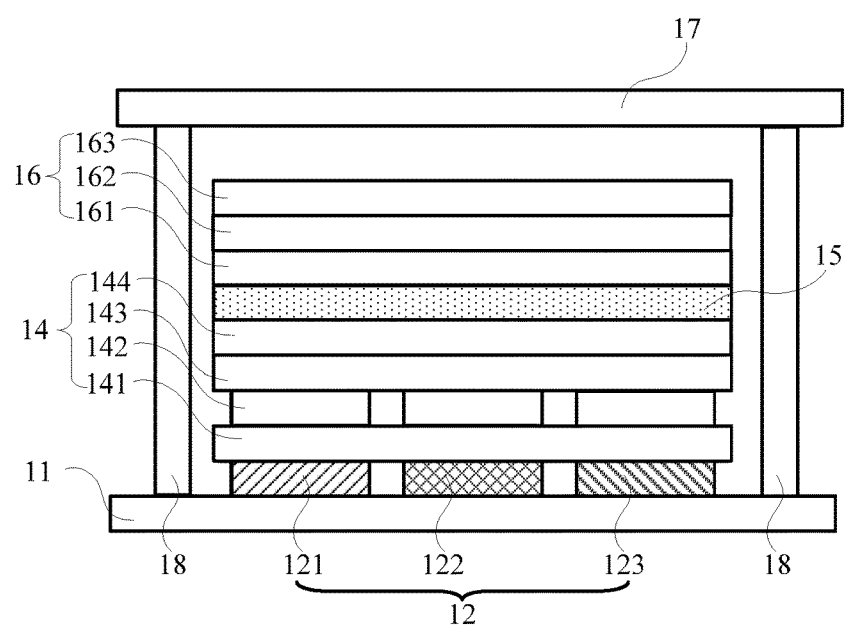
FIG. 9 is a structural illustration of an embodiment made in accordance to an OLED display device in the present invention.

Referring to FIG. 9, FIG. 9 is a structural illustration of an embodiment made in accordance to an OLED display device in the present invention. In the present embodiment, the first structure 14 comprises a thin film transistor array 141, an anode 142, a hole injection layer 143, and a hole transport layer 144 are stacked sequentially. The second structure 16 comprises an electron transport layer 161, an electron injection layer 162, and a cathode 163 are stacked sequentially.

Specifically, the substrate is transparent material, it can be glass or plastic.

The thin film transistor array 141 comprises a semiconductor layer, an insulating layer, a source, a drain, and a gate.

The anode 142 is a transparent conductive metal oxide, such as an indium tin oxide (ITO) or an indium zinc oxide (IZO) conductive thin film. The film thickness of the anode 142 may be 20 nanometers.

The hole injection layer 143 may be an organic small molecule hole injection material, a polymer hole injection material, or a metal oxide hole injection material. The film thickness of the hole injection layer 143 is between 1 nanometer and 100 nanometers.

The hole transport layer 144 may be an organic small molecule hole transport material or a polymer hole transport material. The film thickness of the hole transport layer 144 is between 10 nanometers and 100 nanometers.

The electron transport layer 161 may be a metal complex material or an imidazole type electron transport material. The film thickness of the electron transport layer 161 is between 10 nanometers and 100 nanometers.

The electron injection layer may be a metal complex or an alkaline earth metal and a salt thereof. The film thickness of the electron injection layer is between 0.5 nanometers and 10 nanometers.

The material of the cathode 163 is a low-function metal material such as lithium, magnesium, calcium, strontium, lanthanum, cerium, europium, ytterbium, aluminum, cesium, rubidium, silver and the like, or alloys of these metal materials; the low-function metal materials described above may be used singly or in combination of two or more. The film thickness of the cathode 163 is between 10 nanometers and 1000 nanometers.

Wherein, films corresponding to the thin film transistor array 141, the anode 142, the hole injection layer 143, the hole transport layer 144, the electron transport layer 161, the electron injection layer, and the cathode 163 may each be formed by sputtering, vacuum deposition, or the like.

In addition, as shown in FIG. 9, the OLED display device also comprises a package structure, and the package structure of the present embodiment comprises a cover plate 17 and a packaging adhesive material 18. The cover plate 17 is over the cathode 163 and the packaging adhesive material 18 around the OLED display device. The OLED display device is packaged by packaging adhesive material 18 and the cover plate 17. The cover plate 17 is a glass cover or a flexible material cover. The packaging adhesive material 18 is an epoxy resin or an ultraviolet curing adhesive.

It should be noticed that, the package structure of the OLED display device of the present embodiment is only an application example and is not limited to the package structure of the OLED display device. The package structure of the OLED display device may also be a package structure such as a package structure arranged by alternately stacking a barrier layer and a buffer layer, or be other package structure.

The present invention also provides an OLED display in which the OLED display device in the OLED display may be one of the OLED display devices of FIG. 1, FIG. 4 or FIG. 5, therefore no additional description is given herebelow.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

The invention claimed is:

1. A manufacturing method of organic light-emitting diode display device, wherein comprises:
    arranging a color conversion layer on the substrate by wet film formation; arranging a thin film transistor array, an anode, a hole injection layer and a hole transport layer, a blue light emitting layer, an electron transport layer, an electron injection layer, and a cathode, sequentially;
    wherein the color conversion layer comprises red light conversion units, green light conversion units, and opening units which are arranged separately; the red light conversion unit and the green light conversion unit are both film layers made of an organometallic halide perovskite material; the red light conversion unit and the green light conversion unit absorb respectively blue light emitted from the blue light emitting layer and convert the blue light into red light and green light, and the opening unit transmits the blue light to achieve color display;
    wherein the organometallic halide perovskite material is a single material containing an organometallic halide perovskite material or a mixed material containing a plurality of organometallic halide perovskite materials; and
    wherein the organometallic halide perovskite material has the structural formula $CH_3NH_3PbA_3$, wherein A is at least one element of chlorine, bromine, and iodine.

2. The manufacturing method as recited in claim 1, wherein the film layers have a thickness in the range of [10 nm, 200 nm].

3. The manufacturing method as recited in claim 1, wherein the blue light emitting layer comprises organic host materials and blue light emitting organic guest materials, the doping mass ratio of the organic host material and the blue light emitting organic guest material is 1:0.01 to 1:1.

4. The manufacturing method as recited in claim 1, wherein the blue light emitting organic guest material is organic fluorescent materials, and the organic host material is anthracene derivatives or wide band gap organic materials; or
    wherein the blue light emitting organic guest material is organic phosphorescent materials, and the organic host material is wide band gap organic materials.

5. An organic light-emitting diode display device, wherein comprises:
    a substrate, and a color conversion layer and a blue light emitting layer stacked sequentially on the substrate;
    wherein the color conversion layer comprises red light conversion units, green light conversion units, and opening units which are arranged separately; the red light conversion unit and the green light conversion unit are both film layers made of an organometallic halide perovskite material; the red light conversion unit and the green light conversion unit absorb respectively blue light emitted from the blue light emitting layer and convert the blue light into red light and green light, and the opening unit transmits the blue light to achieve color display;

wherein the organometallic halide perovskite material is a single material containing an organometallic halide perovskite material or a mixed material containing a plurality of organometallic halide perovskite materials; and wherein the organometallic halide perovskite material has the structural formula $CH_3NH_3PbA_3$, wherein A is at least one element of chlorine, bromine, and iodine.

6. The organic light-emitting diode display device as recited in claim 5, wherein further comprises a thin film transistor array, an anode, a hole injection layer, and a hole transport layer are stacked sequentially between the color conversion layer and the blue light emitting layer; and an electron transport layer, an electron injection layer, and a cathode are stacked sequentially on the blue light emitting layer.

7. The organic light-emitting diode display device as recited in claim 5, wherein the film layers have a thickness in the range of [10 nm, 200 nm].

8. The organic light-emitting diode display device as recited in claim 5, wherein a green light conversion subunit is further arranged on the red light conversion unit.

9. The organic light-emitting diode display device as recited in claim 5, wherein the blue light emitting layer comprises organic host materials and blue light emitting organic guest materials, the doping mass ratio of the organic host material and the blue light emitting organic guest material is 1:0.01 to 1:1.

10. The organic light-emitting diode display device as recited in claim 9, wherein the blue light emitting organic guest material is organic fluorescent materials, and the organic host material is anthracene derivatives or wide band gap organic materials; or wherein the blue light emitting organic guest material is organic phosphorescent materials, and the organic host material is wide band gap organic materials.

11. The organic light-emitting diode display device as recited in claim 5, wherein the color conversion layer further comprises white light conversion units, and the white light conversion unit comprises opening subunits, red light conversion subunits and green light conversion subunits arranged side by side; the white light conversion units convert blue light emitted from the blue light emitting layer into white light.

12. The organic light-emitting diode display device as recited in claim 11, wherein the red light conversion unit, the green light conversion unit, the opening unit, and the white light conversion unit in the color conversion layer are arranged sequentially or arranged in an array.

13. An organic light-emitting diode display wherein comprises an organic light-emitting diode display device and a drive control circuit, the drive control circuit is connected to the organic light-emitting diode display device to supply drive signals and control signals to the organic light-emitting diode display device;

the organic light-emitting diode display device comprising:

a substrate, and a color conversion layer and a blue light emitting layer stacked sequentially on the substrate;

wherein the color conversion layer comprises red light conversion units, green light conversion units, and opening units which are arranged separately; the red light conversion unit and the green light conversion unit are both film layers made of an organometallic halide perovskite material; the red light conversion unit and the green light conversion unit absorb respectively blue light emitted from the blue light emitting layer and convert the blue light into red light and green light, and the opening unit transmits the blue light to achieve color display;

wherein a green light conversion subunit is further arranged on the red light conversion unit.

14. The organic light-emitting diode display as recited in claim 13, wherein the film layers have a thickness in the range of [10 nm, 200 nm].

15. The organic light-emitting diode display as recited in claim 13, wherein the organometallic halide perovskite material is a single material containing an organometallic halide perovskite material or a mixed material containing a plurality of organometallic halide perovskite materials;

and wherein the organometallic halide perovskite material has the structural formula $CH_3NH_3PbA_3$, wherein A is at least one element of chlorine, bromine, and iodine.

16. The organic light-emitting diode display as recited in claim 13, wherein the blue light emitting layer comprises organic host materials and blue light emitting organic guest materials, the doping mass ratio of the organic host material and the blue light emitting organic guest material is 1:0.01 to 1:1.

17. The organic light-emitting diode display as recited in claim 13, wherein the blue light emitting organic guest material is organic fluorescent materials, and the organic host material is anthracene derivatives or wide band gap organic materials; or wherein the blue light emitting organic guest material is organic phosphorescent materials, and the organic host material is wide band gap organic materials.

* * * * *